United States Patent [19]

Harris et al.

[11] Patent Number: 5,041,719
[45] Date of Patent: Aug. 20, 1991

[54] TWO-ZONE ELECTRICAL FURNACE FOR MOLECULAR BEAM EPITAXIAL APPARATUS

[75] Inventors: Karl A. Harris; Thomas H. Myers, II, both of Liverpool, N.Y.

[73] Assignee: General Electric Company, Syracuse, N.Y.

[21] Appl. No.: 531,558

[22] Filed: Jun. 1, 1990

[51] Int. Cl.5 .................. C23C 16/00; F27B 5/06; F27D 11/00
[52] U.S. Cl. .................. 219/390; 118/725; 118/726
[58] Field of Search .......... 219/390; 392/388; 118/715, 719, 726, 725; 427/49, 50, 51

[56] References Cited

U.S. PATENT DOCUMENTS

| | | | |
|---|---|---|---|
| 4,518,864 | 5/1985 | Freeouf et al. | 219/271 |
| 4,646,680 | 3/1987 | Maki | 118/726 |
| 4,878,989 | 11/1989 | Purdes | 118/725 |

OTHER PUBLICATIONS

In Situ Growth Surface Termperature Measurement for MBE Growth of CdTe, ZnTe and Cd1−xZnxTe Alloys/D. Rajavel, F. Mueller, B. K. Wagner, R. G. Benz II and C. J. Summers/J. Vac. Science Tech. A 8(2), Mar./Apr. 1990, pp. 1002-1005.
Dimer Arsenic Source Using a High Efficiency Catalytic Cracking Oven for Molecular Beam Epitaxy/J. C. Garcia, A. Barski, J. P. Contour and J. Massies/Appl. Phys. Lett. 51(8), 24/8/87/ pp. 593-595.
Material Effects on the Cracking Efficiency of MBE Arsenic Cracking Furnace/R. L. Lee, W. J. Schaffer, Y. G. Chai, D. Liu, J. S. Harris/Jour. Vac. Science, Tech. B4(2)/Mar./Apr. 1986/ pp. 568-570.
Growth of HgCdTe and other Hg-Based Films and Multilayers by MBE K. A. Harris, S. Hwang; D. K. Blanks; J. W. Cook, Jr.; J. F. Schetzina and N. Otsuka-Jour. Sci. Tech. A4(4)/Jul./Aug. 1986, pp. 2061-2066.
Properties of CdTe Films Grown by MBE/T. H. Myers II/Department of Physics Thesis 1983/11 pages.
Riber Offers the Widest Range of M.B.E. Evaporation Cells/P. Branche and J. C. Garcia/Riber Brochure/5 pages.

Primary Examiner—Bruce A. Reynolds
Assistant Examiner—Tuan Vinh To
Attorney, Agent, or Firm—Richard V. Lang; Paul Checkovich; Fred Jacob

[57] ABSTRACT

The invention relates to molecular beam epitaxial (MBE) processing and more particularly to a two zone electrical furnace for use with high vapor pressure II-VI materials. The furnace is designed for use with effusion type crucibles requiring a lower temperature in the fill zone to control the flux and a higher temperature in the orifice zone to avoid clogging the customary collimating orifice. Each zone is heated by a distributively heated radiator, the fill zone radiator being of a tantalum foil construction of low thermal conductance, while the orifice zone radiator is a solid molybdenum cylinder of relatively high thermal conductance. The zones are joined by linking the two radiators by a thermally conductive path, while the shields and the distributed heaters of the respective zones are separated to reduce thermal coupling. The arrangement provides substantial independence between the temperature settings of the two zones and the molybdenum construction is free of erosion from tellurium based reagents.

7 Claims, 6 Drawing Sheets

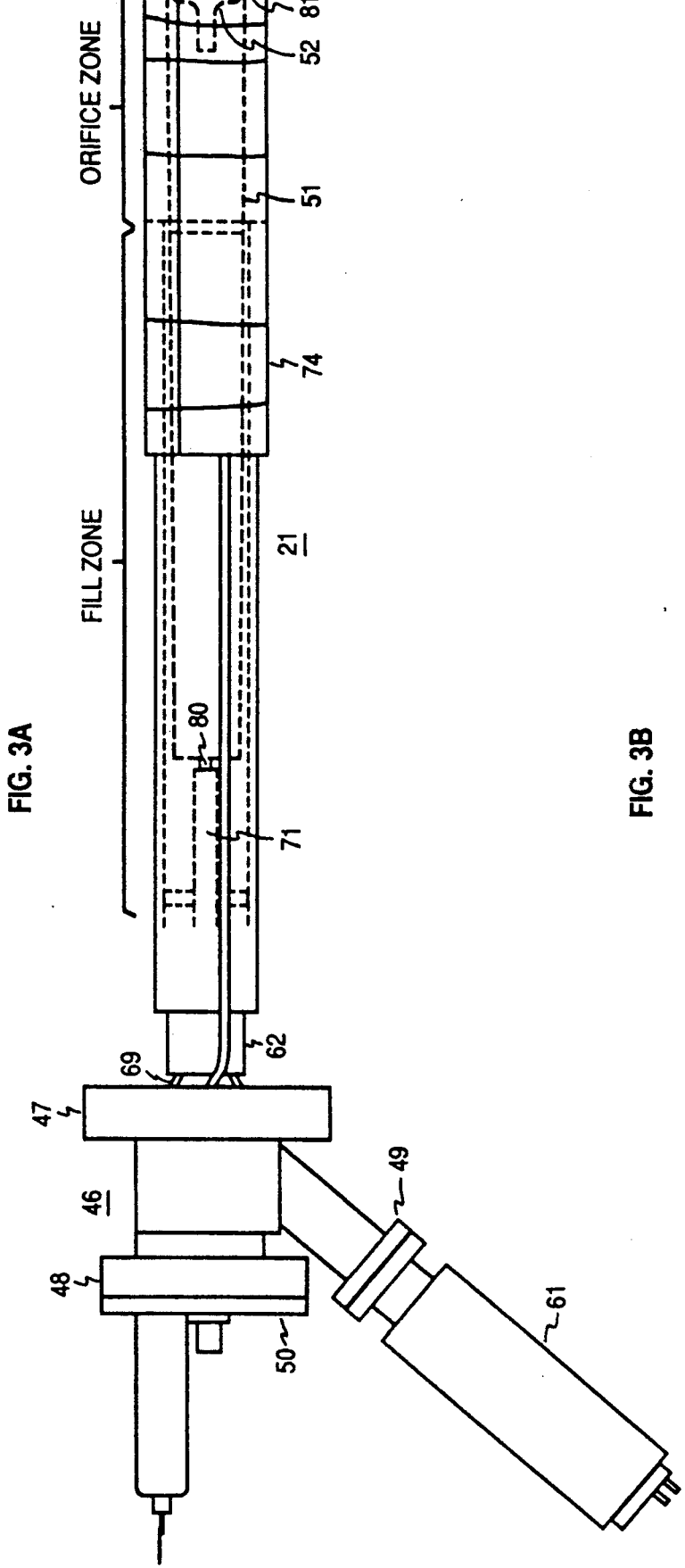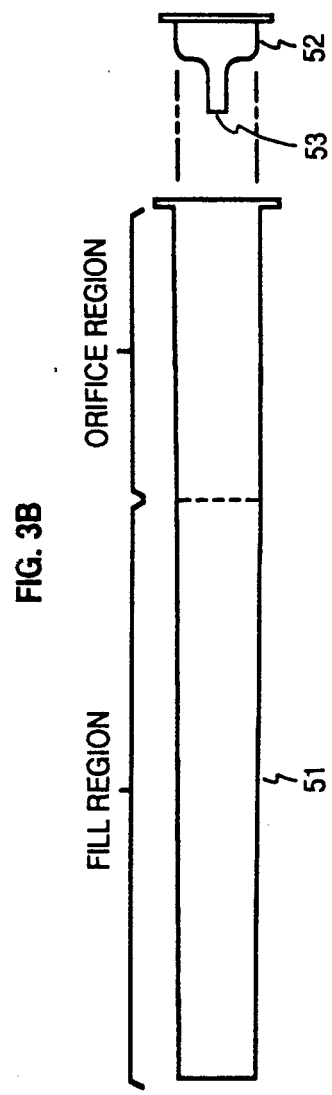
FIG. 3A
FIG. 3B

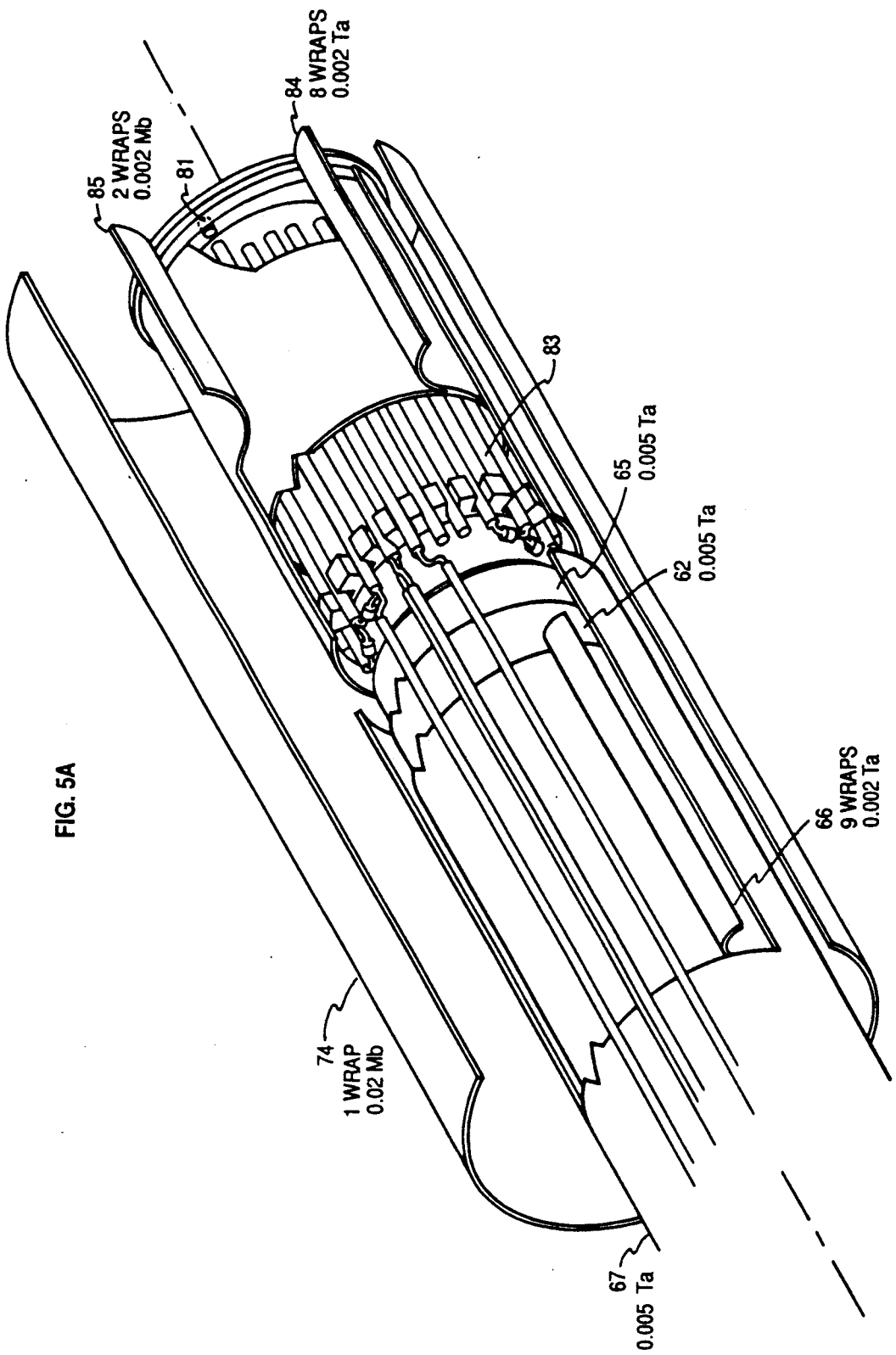

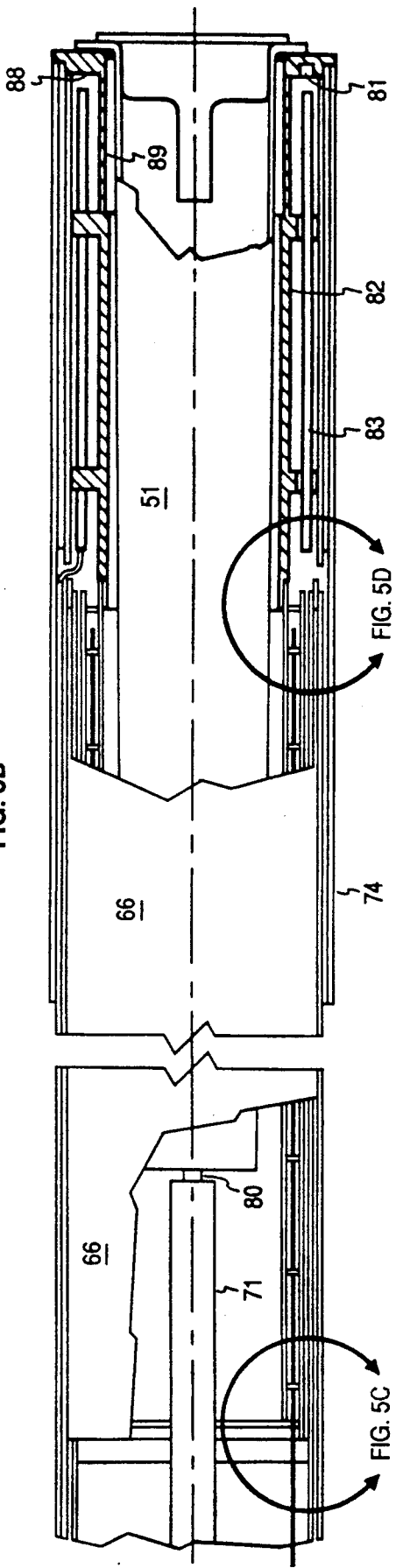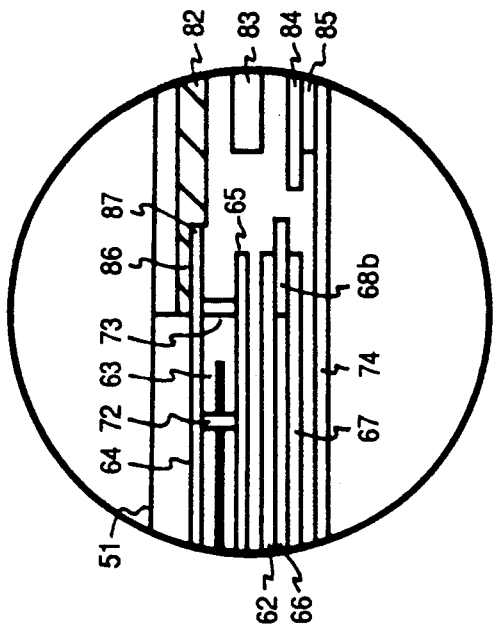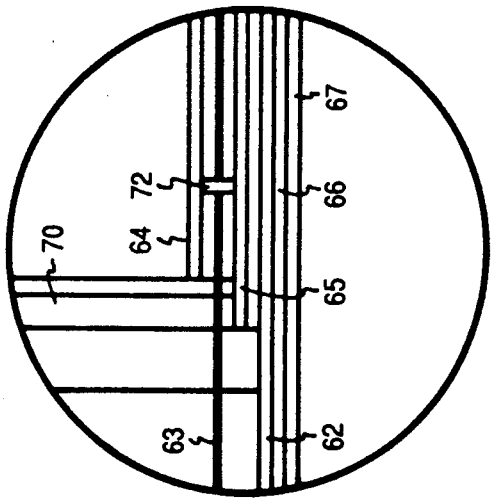

TWO-ZONE ELECTRICAL FURNACE FOR MOLECULAR BEAM EPITAXIAL APPARATUS

BACKGROUND OF THE INVENTION

1. Field of The Invention

The invention relates to molecular beam epitaxial (MBE) processing and more particularly to a two-zone electrical furnace for MBE processing.

2. Prior Art

Since 1981 interest in the MBE technique for the growth of mercury cadmium telluride (MCT) has rapidly increased. MCT is an important infrared detector material, potentially suitable for making high resolution focal plane arrays. The interest in the MBE technique for MCT growth stems from the potential for greatly improving the quality of the MCT material compared to that achieved using liquid phase epitaxy or bulk-grown MCT. An improved MCT material would lead to the ability to produce superior infrared focal plane arrays for second-generation imaging systems. The technique should also produce complex device structures such as super lattices or infrared lasers.

Although MBE has been established as a preferred process for the growth of III-V materials such as GaAs and AlAs, the MBE growth of II-VI materials is in its infancy and is significantly complicated by a number of factors. These factors are related to the general instability of MCT and the relatively high vapor pressures of the constituent materials.

One important requirement for the growth of MCT by the MBE process is a stable molecular beam of the constituent materials, Te, CdTe, or Cd. The general approach for producing these molecular beams is to load the pure, clean elemental or compound material into an effusive crucible for insertion into a single zone furnace, typically made from the refractory metal tantalum. A thermocouple, in intimate contact with the bottom of the crucible, serves as the sensor for a temperature controller. The heating elements are set inside a radiator of tantalum foil and are shielded externally by several wraps of tantalum foil. Typically, the furnace is positioned in an MBE system such that it is thermally isolated from other furnaces —which may be operating simultaneously—by a cryoshroud maintained at 77K. Evaporation of the source material at a rate determined by the furnace temperature, creates a molecular beam of the material. The beam is directed toward the growth surface on a substrate supported in the reaction chamber to form an epitaxial layer. The single zone furnace of this design works well for the evaporation of III-V materials such as GaAs or AlAs but not as well for II-VI materials.

The major problem in using a furnace of a conventional single zone design for II-VI materials such as Te, which require an effusion type crucible, is the inherent temperature gradient along the length of the furnace. The region at or near the top of the crucible and adjacent the reaction chamber is cooler than the region at the base of the crucible due to radiative heat losses to the adjacent cryoshroud and to the reaction chamber. The lower temperature promotes recondensation of the II-VI materials at the top of the crucible. In an open crucible, the end result is a gradual clogging at the top of the crucible which leads to a time dependent decrease in the molecular flux being deposited on the substrate. In an effusion type crucible, required for MCT, clogging occurs rapidly, making it virtually impossible to grow compositionally uniform MCT using a conventional single zone furnace.

The problem of furnace clogging is well known in the II-VI community. The few attempts to solve this problem center on providing additional heat to the open end of the furnace. For example, two different types of solutions are known commercially: (1) increasing the resistance of the heaters near the top of the furnace by etch-thinning that part of the heater assembly and (2) installing the heaters only at the top of the furnace. The problem with the first solution is that it only works for a narrow temperature range. Varying the molecular beam flux out of this small temperature window again produces clogging. The problem with the second solution is that a temperature gradient exists in reverse and does not provide a stable beam flux. An additional problem that arises from these solutions is that telluriium reacts with hot tantalum, effectively destroying the furnace in the region of the orifice over time.

A proposed solution has been to create a heated region at the top of the furnace which is independently controlled. This approach has been used in a variety of other applications, such as arsenic crackers. While this approach would appear to be most promising for growing II-VI materials using effusion type crucibles, the known designs are not wholly satisfactory. While achieving a measure of flux stability, and avoiding clogging, precise flux control has been difficult, and the known designs have suffered from limited lifetimes due to their reactivity at high temperatures with tellurium. This reactivity has also tended to contribute impurities to the epitaxial layers formed on the substrate.

SUMMARY OF THE INVENTION

Accordingly, it is an object of the present invention to provide an improved furnace for use in a molecular beam epitaxial (MBE) apparatus for use with an effusion type crucible.

It is another object to provide an improved MBE furnace for growing II-VI materials.

It is still another object of the invention to provide a two zone MBE furnace for use with an effusion type crucible for evaporating high vapor pressure materials with stable flux control for extended periods of time.

It is still another object of the invention to provide a more independently controllable two zone MBE furnace for evaporating tellurium based reagents.

It is a further object of the invention to provide a two zone MBE furnace which is resistive to chemical erosion in processing tellurium based reagents.

It is an additional object of the invention to provide a novel two zone MBE furnace which is easily fabricated.

These and other objects of the invention are achieved in a novel two zone electrical furnace comprising a fill zone and an orifice zone heating means.

The fill zone heating means encircles the fill region of the crucible and heats the reagent to a first temperature to establish the vapor pressure required for a desired molecular flux. The fill zone heating means comprises an electrical heating element of a distributed design, a fill zone heat radiator of a refractory metal of relatively low thermal conductance disposed between the crucible and the fill zone heating element, a fill zone heat shield of a multiple layer refractory foil for reducing outward heat loss, and a fill zone thermostat for regulating the heat output of the fill zone heating element to maintain a desired first temperature.

The orifice zone heating means heats the orifice region of the crucible to a second temperature, higher than the first temperature, to prevent condensation of the reagent on the orifice. The orifice zone heating means comprises an electrical heating element of a distributed design, and an orifice zone heat radiator of a refractory metal of a relatively high thermal conductance relative to the fill zone radiator. The orifice zone radiator has adequate thermal conductance for equalizing the surface temperature over the spaces between individual conductors of the heating element and against thermal loading provided at the portion of the orifice zone proximate to the reaction chamber.

The orifice zone heating means also includes an orifice zone heat shield of a multiple layer refractory foil to reduce outward heat loss, and an orifice zone thermostat responsive to the temperature in the orifice region. In addition, the fill zone and orifice zone heating means, while contiguous to prevent a fall in temperature between zones, remain in a low heat exchanging relationship to permit a large temperature difference between zones. The heat radiators of respective zones are thus in conductive thermal contact while the heating elements and heat shields of the respective zones are separated and spaced apart to prevent heat exchange.

The controlled low heat exchange essential to independent operation of the two zones without causing condensation of the reagent at the region between zones or in the collimating orifice itself takes place principally by conduction from the high thermal conductance orifice zone radiator to the low thermal conductance fill zone radiator.

Further in accordance with the invention, the fill zone radiator is of a thin tantalum foil construction for low heat conductance, while the orifice zone radiator is of a rigid molybdenum material of thick cross-section for suppressing axial gradients in the orifice zone.

BRIEF DESCRIPTION OF THE DRAWINGS

The inventive and distinctive features of the invention are set forth in the claims of the present application. The invention itself, however, together with further objects and advantages thereof, may best be understood by reference to the following description and accompanying drawings, in which:

FIGS. 3A and 3B are illustrations respectively of a novel two-zone furnace in accordance with the invention, and an effusion type crucible, for which the furnace is suited, requiring different temperatures in the fill and orifice regions;

FIGS. 5A-5D are more detailed views of the construction of the novel furnace; FIG. 5A showing both zones in a broken-away perspective view; FIG. 5B being a cross-section view of both zones; FIG. 5C being an expanded view of the cross-section of fill zone; and FIG. 5D being an expanded view of the cross-section at the boundary between the fill and orifice zones.

DESCRIPTION OF THE PREFERRED EMBODIMENT

Figure 1:
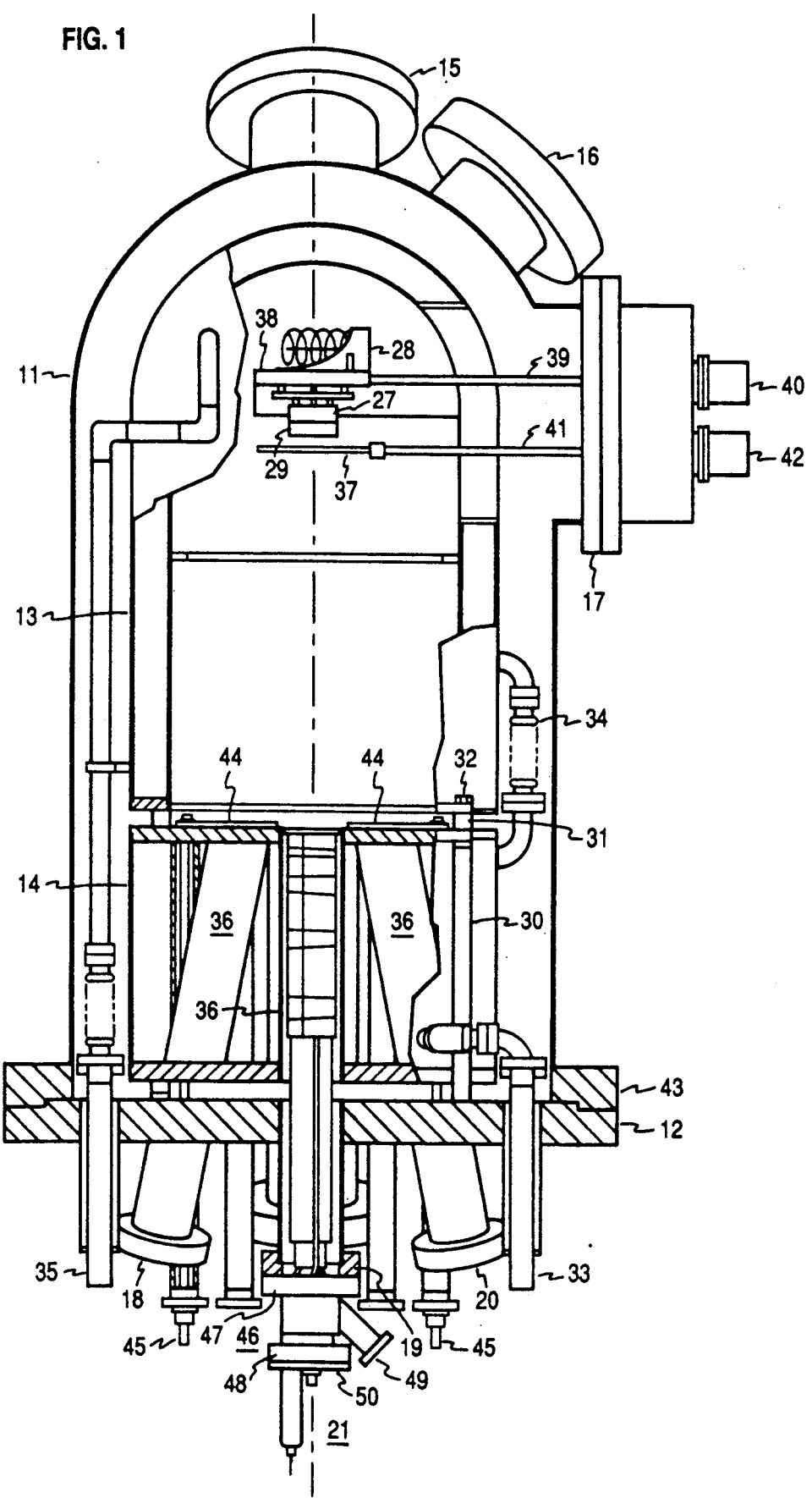
FIG. 1 is a modified cross-section view of a molecular beam epitaxial apparatus (MBE), which is designed to employ plural sources, one of which, a novel source embodying the invention, is shown in operating position in the apparatus.

A novel molecular beam source for use in an apparatus for performing the molecular beam epitaxial (MBE) process is illustrated in the drawings.

The MBE process of particular interest is that associated with the growth of tellurium and mercury based films. A more general description of the apparatus for forming this class of films and its operation is set forth in the article entitled "GROWTH OF HgCdTe AND OTHER Hg-BASED FILMS AND MULTILAYERS BY MOLECULAR BEAM EPITAXY" by K. A. Harris, S. Hwang, D. K. Blanks, J. W. Cook, Jr., J. F. Schetzina and N. Otsuka (July/August 1986 J. Vac. Sci. Technol. A4(4), pages 2061-2066).

Briefly, the apparatus for forming epitaxial layers maintains a substrate in an evacuated chamber in the path of molecular beams supplied from one or more sources. The substrate, which is heated to a temperature of 150°-300° C., is exposed through a mechanical shutter for a measured time to the molecular beams during the process. The desired high vacuum of $6 \times 10^{-11}$ Torr, normally unattainable in the presence of mercury reagents and other contaminents, is facilitated by the use of a two-part cryogenic shroud maintained at the temperature of liquid nitrogen.

Each source for the MBE apparatus includes a furnace for elevating the temperature of the reagent to vaporize it and a crucible of refractory material contained within the furnace for holding the reagent as it is being vaporized. The temperature of the reagent is closely controlled to control the rate of vaporization. Free molecules making up the vapor are then expelled from the crucible toward the substrate at a velocity distribution primarily dependent upon the temperature within the crucible. In a high vacuum, the individual molecules, once clear of the small opening of the source, continue in a substantially straight line direction to the substrate. The preferred crucible design utilizes Knudsen principles, such that the opening is sufficiently small to insure a saturated vapor at the interface between the vaporized and unvaporized reagent. Upon impinging upon the substrate and attaching to suitable crystalline sites, the molecules in the beam produce coatings which are highly uniform in composition and in thickness. Layers, as thin as several Angstrom units, may be formed by the MBE process with the uniformity required of semiconductor devices operating in the infrared portion of the frequency spectrum.

Figure 2:
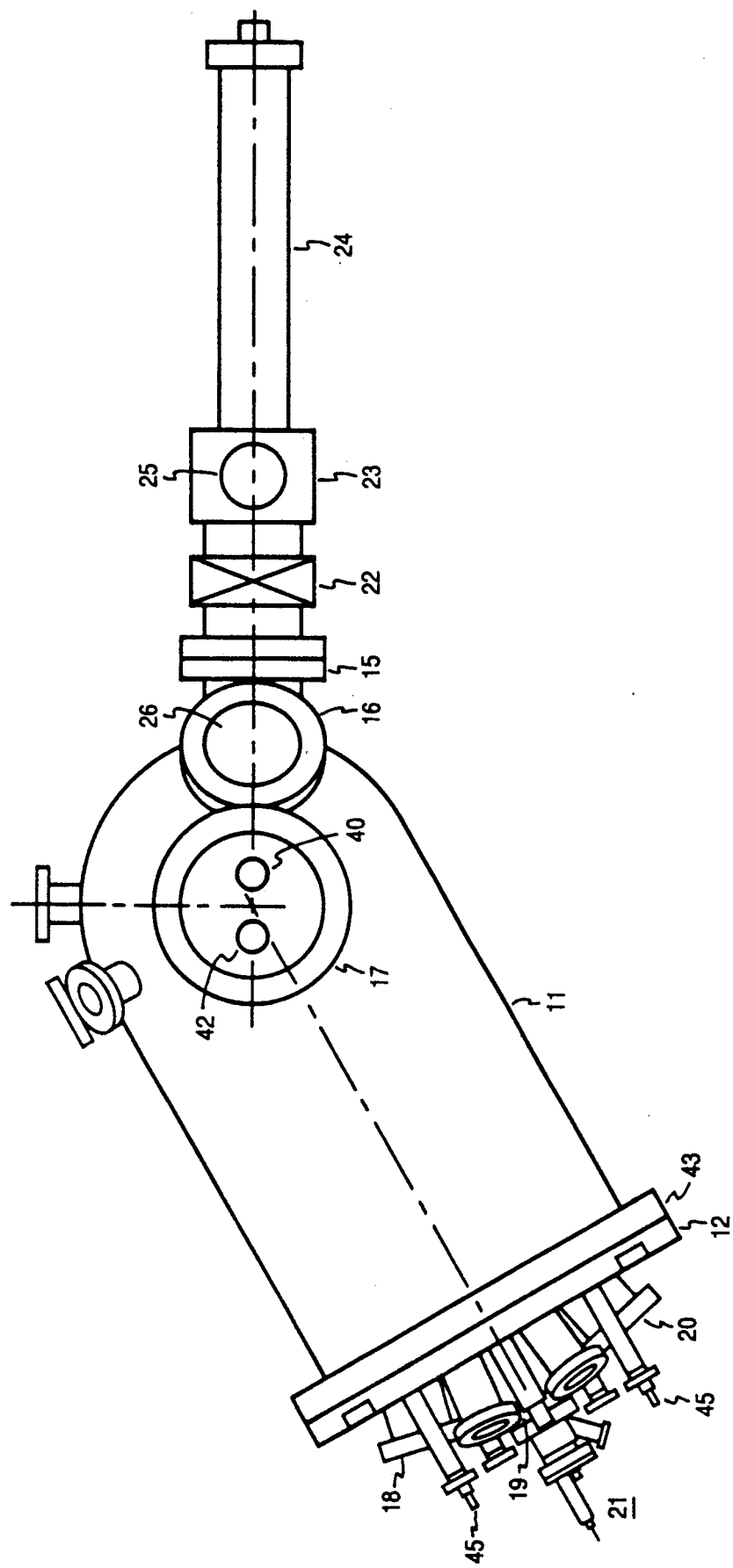
FIG. 2 is a side elevation view of the molecular beam epitaxial apparatus illustrated in FIG. 1, FIG. 2 illustrating the tilted orientation of the MBE apparatus in respect to a horizontal plane and three operating ports of the MBE apparatus.
Figure 4:
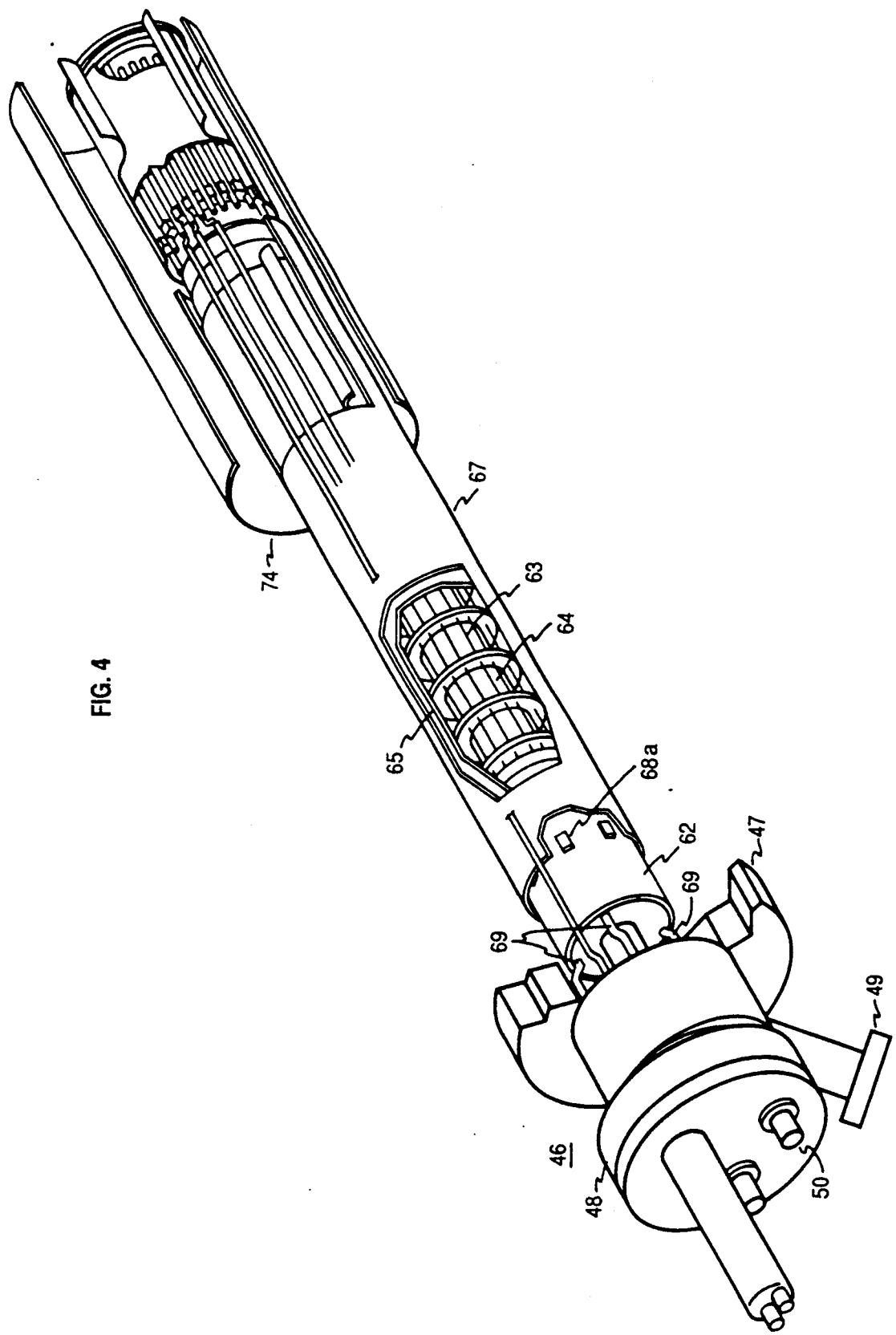
FIG. 4 is an overall perspective view of the construction of the novel furnace, showing the fill and orifice zones.

The MBE apparatus, which uses the novel source for forming tellurium based films, is illustrated in FIGS. 1 and 2. The outer chamber 11 of the MBE apparatus is itself at room temperature, but maintains the vacuum for the epitaxial process and surrounds the cryogenic shroud, which maintains low temperature surfaces around the reaction chamber.

In FIG. 1, the MBE apparatus is shown in a modified cross-section view taken in a plane parallel to the axis of the chamber The outer chamber 11 of the MBE apparatus is generally cylindrical, with a dome shaped top, and a bottom supported with a vacuum tight seal upon a substantially flat circular flange or base plate 12. Flanges which permit vacuum tight seals for ports into the chamber I1 are provided at the dome, cylindrical sides and base plate 12.

The view of FIG. 1 illustrates the outer vacuum chamber 11, the base plate 12, the two-part cryogenic shroud 13, 14 set inside the vacuum chamber, and the flanges associated with the substrate operating ports and the sources. The flanges 15, 16 and 17 for the substrate operating ports are located on the dome of the chamber 11. Three flanges for the MBE sources are illustrated at 18, 19, and 20. They enter the vacuum chamber 11 thru the base plate 12. In order to simplify the illustration, other ports which are required for other sources and for the main vacuum system have not been illustrated.

The novel tellurium based source 21, is shown attached to the flange 19, at the opening for a port oriented along the axis of the MBE chamber.

The orientation of the chamber in relation to the horizontal plane is illustrated in the side elevation view of FIG. 2. In particular, the chamber 11 is supported with the axis tilted 30° from horizontal with the base down and the dome up. This orientation of the chamber permits the crucibles to assume an upwardly tilted position, so that the contained liquids or solids are retained without spilling.

Both FIGS. 1 and 2 illustrate the three substrate operating ports. The flange 15 for attaching the sample loading means is shown at the top of the chamber in the FIG. 1 view and to the right of the chamber in the FIG. 2 view. A gate valve 2 attached to the flange 15 is provided for sealing off the reaction chamber while transfer is taking place.

A six-way "Cross" 23 to the right of the gate valve 20 provides means for installing the substrate into the holder of the substrate transfer device 24 which is mounted on one face of the Cross, remote from the chamber. It is used to transfer substrates into the substrate holder 27 within the reaction chamber. A lateral port 25 of the six-way Cross, oriented toward the viewer in FIG. 2, is used for loading the transfer device. The flange 16 supports the primary viewing port 26, which gives one a view of the substrate holder 27, the substrate 29 (during and after being positioned in the holder) and the ion gauge 28 within the reaction chamber. The flange 17 is provided for attaching the substrate manipulator.

FIG. 1 shows the principal constructional features of the MBE apparatus which permit high vacuum operation. The dome shaped cylindrical chamber is provided with a circular flange 43 for attaching the chamber to the base plate 12. A vacuum sealing ring (not illustrated) is provided between the two members. The two members 43 and 12 are fastened together by means of bolts (also not illustrated) set around the perimeter of the two members. All entrances into the chamber 11 are similarly provided with flanges to which mating flanges are fastened to form high vacuum seals. The arrangement is continuously pumped to maintain the desired high vacuum.

The arrangement for supporting the cryogenic shroud provides for minimum heat leakage to the outside environment. As earlier noted, the cryogenic shroud 13, 14 is of a two-part construction, with an upper portion 13 surrounding the reaction chamber, and the lower portion 14 surrounding entrance tubes (36) and shutters 44 for each source. The two-part cryogenic shroud (13, 14) is set inside the chamber 11 and the two parts are supported in a spaced relationship to the chamber 11 by means of four bolts 32, and four hollow tubular legs 30. The legs 30 screw into the base plate 12 and extend between the top of the base plate 12 and four mounting brackets on the upper surface of the lower shroud with a threaded rod, a part thereof, extending through the mounting brackets of the upper shroud. Spacers 31 extend between the four mounting brackets on the lower shroud and four mounting brackets on the lower surface of the upper shroud. The four bolts 32, fasten the four mounting brackets of the upper shroud 13, the spacers 31, and the four mounting brackets of the lower shroud 14 to the four legs 30, thus securing the cryogenic shroud to the base plate 12 and within the chamber 11. The internal paths for supporting the two shrouds inside the evacuated chamber are thus long ones of low cross-sections and result in minimum heat conduction between the cooled shroud and the chamber.

Thus, the only thermally conductive contact between the cryogenic shroud and the chamber 11 at ambient temperatures is by means of the four attaching legs whose construction has just been described and the pipes used to circulate the coolant for the two-part shroud which will shortly be described. The upper shroud, as illustrated, is in the configuration of a double walled bell jar made of stainless steel with the space between walls of the bell jar filled with liquid nitrogen coolant. The lower cryogenic shroud also contains a sealed chamber filled with liquid nitrogen coolant. The chamber is penetrated by a plurality of the cylindrical tubes 36, which pass through the chamber and are sealed to the top and bottom plates thereof in such a way that the lower shroud remains sealed and no liquid nitrogen escapes.

The two shrouds are serially connected to a common source of liquid nitrogen coolant. As seen in FIG. 1, the coolant enters the lower cryogenic shroud at the pipe 33, fills the lower cryogenic shroud 14 and passes upwardly through the pipe 34 which enters the upper shroud. A thermostat (not shown) attached to the top of the upper shroud is used as the sensor for a controller which maintains a constant level of $LN_2$. This level is maintained by periodically venting the boiled off $N_2$ through a solenoid operated valve, automatically controlled by the controller.

The substrate 29, upon which the epitaxial layer is being formed, is disposed in the reaction chamber upon the center line of the chamber and on a line of sight from the furnace tubes 36. It is supported upon a substrate holder 27. The substrate holder is in turn supported upon one face of the rotatable stage 38, the other face supporting a "nude" ion gauge 28. The stage 38 is in turn supported upon the shaft 39 which may be rotated by the external knob 40 to expose either the ion gauge 28 or the substrate 29 to upwardly directed molecular beams. The ion gauge is exposed to the molecular beam in order to measure the flux in the beam, and the substrate is turned toward the beam to form an epitaxial layer.

A shutter 37 set on a shaft 41 between the furnace in the lower shroud and the rotatable sample stage 38, is used to initiate and terminate the exposure of the stage to the upward molecular beams and thus accurately control the duration of the exposure of the substrate to the beams. The shutter is manipulated by the external push-pull knob 42. The arrangement permits the control of molecular beam exposure to the substrate 29, the nude ion gauge, or an empty substrate holder 27.

The arrangement of the shutter 37 and rotatable stage 38 permits a close control of the formation of the epitaxial layer. The magnitude of the molecular flux is adjusted by rotating the ion gauge into the path of a molecular beam, and opening the shutter briefly to expose the ion gauge to the molecular beam. The temperature of the source is then adjusted for a desired flux level, by means that will be elaborated hereinafter. When source conditions have stabilized, growth can then take place.

The furnaces, one of which is shown at 21, are installed in the tubes 36 terminating in the attachment flanges 18, 19, 20. The furnaces are flanged and when attached are positioned such that the tops of the furnaces are just below the top edge of the lower cryogenic shroud 14. The tubes 36 are provided with shutters 44, which are adjusted through rotating control knobs 45 between an open and a closed condition. The shutters allow the beams from individual furnaces to be turned on or off while the heat temperature within the furnace may be maintained. In the typical application, two or three shutters are open simultaneously to allow simultaneous beams from two or three sources.

The cryogenic shrouds 13, 14 are important for efficient MBE operation. They are required whenever a mercury reagent is present or whenever plural reagents are needed in the epitaxial process. The upper shroud 13 creates low temperature surfaces surrounding the reaction chamber and the lower shroud 14 creates a low temperature environment around each furnace. The benefit from keeping the internal surfaces of the reaction chamber cold is to "getter" stray particles which can interfer with the growth process. The cold surfaces also freeze out excess Hg so that the ultra high vacuum can be maintained. In addition, the lower shroud provides thermal isolation between individual furnaces so that they may operate at temperature settings dependent upon the desired vaporization rates of the individual reagents and independent of higher or lower temperatures in adjacent furnaces.

The MBE apparatus conventionally uses several sources, depending upon the epitaxial layers being formed. Of particular interest to the present invention is a source which can be used in an MBE apparatus to process materials of which tellurium and tellurium compounds are the most important. The films of particular interest include tellurium (Te), cadmium telluride (CdTe), mercury cadmium telluride (HgCdTe), and mercury telluride (HgTe), and superlattices of some of the same materials. The materials of this group are of particular use in infrared (IR) detector applications. In IR applications, the material may be used for high resolution infrared cameras. Here the individual cells (i.e. pixels) in rows and columns are reproduced to a high density over a large area of a substrate to form the IR sensitive focal plane of the camera. In such applications, it is essential that the active material in the epitaxial layers be of high compositional uniformity and high crystalline perfection if pixels occurring in as large as a few thousand are to be formed free of defects.

The novel source for tellurium based films is depicted in FIG. 3A and subsequent figures. The source consists of a novel two zone furnace 21 and a capped refractory crucible (51, 52 and 53) for insertion into the furnace. The crucible contains the reagent which, when vaporized in the furnace, forms the molecular beam of the MBE process. In FIG. 3A, the assembled furnace is shown with the crucible set inside.

The crucible, best seen in FIG. 3B, is of the effusion type also referred to as a "Knudsen cell". The crucible is of a refractory material, typically pyrolytic boron nitride. It is of a two part construction consisting of a flanged open ended tube 51 of tapered cross-section and a cup shaped cap 52 also flanged, having a tubular orifice 53 of reduced diameter, dimensioned to support effusion type operation and to provide collimation of the molecular beam.

The cup shaped cap 51, 52 is a cylinder, flanged at the outer end with a recessed bottom from which a small tube 53 forming the collimating orifice extends. The flange of the crucible cap 52 and the flange of the crucible tube 51 are dimensioned so that the two flanges may be brought into contact to close the perimeter of the crucible to prevent significant leakage of flux. The outer diameter of the cap is accordingly being sufficiently smaller than the inner diameter of the tube 51 to allow contact between flanges. A tie-down closure (not shown) may also be provided to maintain the cap in closed position. The small tube 53, which extends toward the interior of the crucible from the recessed bottom of the cap is of a sufficiently small diameter to restrict the escape of flux from the crucible and sufficiently long for collimation of the molecular beam, features which are useful in effusion cell operation.

The reentrant construction of the crucible cap, as described above, is designed to reduce clogging from condensation of the reagent. When the cap 52 is seated, with the flanges of members 51 and 52 in contact, the elongated tube 53, forming the orifice through which the molecular reagent passes, is set back into the interior of the crucible and surrounded by the heated molecular vapor filling the crucible interior. The reentrant construction thus shields the orifice from the radiation cooling that a non-reentrant design would experience when exposed to the cooler interior surfaces of the MBE apparatus. The reentrant crucible design thus helps in keeping the collimating orifice at the higher temperature useful in avoiding clogging.

The crucible parts are formed by a standard pyrolytic casting process due to the refractory nature of the constituent material. The main portion of the crucible has a long tapered design, the tapering being required to allow withdrawal of the formed crucible from the mold. The crucible is typically about 8" in length with an inner diameter at the open end of approximately 0.8", tapering gradually to the bottom. When the cap flange is seated against the crucible flange, the bottom of the cap is recessed approximately 154" from the crucible flange, and the collimating orifice extends toward the interior of the crucible by an additional ⅜". Thus, the collimating orifice 53 has an inner diameter of about 0.08" and a length of about 0.37".

The present furnace, which is of a two zone design, is intended to accommodate the crucible which has just been described. The first zone of the furnace is designed to operate over the fill region of the crucible, and the second zone is designed to operate over the orifice region. Referring again to FIG. 3A, the furnace 21 may be seen to be supported by the flanged port 19 illustrated in FIGS. 1 and 2. The furnace 21 is provided with an adaptor nipple 46 having primary inner 47 and outer 48 flanges at both ends of the nipple along its axis and a secondary flange 49 attached at an angle to the axis of the nipple. The electrical connections to the heater and thermocouple of the fill zone of the furnace are taken through the flange cover 50, fastened to the flange 48. Corresponding electrical connections for the heater and thermocouple of the orifice zone are taken through the connector housing 61 shown fastened to the flange 49.

The flange 47 is fastened to the flange 19 of the MBE apparatus and provides a vacuum sealed support for the furnace assembly within the MBE apparatus.

The crucible is approximately 3" longer than a conventional crucible and is designed to take a charge of approximately 150 grams of tellurium based reagent. The reagent is normally provided in two 3"×⅝" cylindrical slugs dimensioned to fit within the crucible. Two such slugs load the crucible to a point about 1" below the inner end of the cap 52. The initial heating, which melts the charge results in the surface of the charge falling an additional distance to approximately five inches from the bottom of the 8" crucible. In the FIG. 3A illustration, the upper surface of the charge should not extend beyond the boundary between the two zones of the furnace. In the event that too much charge is provided, the starting procedure (in which the outer zone is super heated) may be used to evaporate off of the reagent at a high rate until the level of the charge falls within the fill zone of the furnace.

The crucible design, so far described, is suitable for approximately 140 hours of furnace operation, and the design provides constant flux throughout the life of the charge. Since the schedule in low volume MBE production takes the greater part of a day, the formation of each film is ordinarily done on successive days. In certain extreme cases, the time required to form a film may be as long as 24 hours, but in the usual cases the times required rarely exceed 15 hours, and may often be as short as an hour. In conventional low volume processing, the charge will thus last long enough for a total of approximately 150 microns of epitaxial growth. The furnace is ordinarily reset for each run, and the flux levels adjusted by reference to the ion gauge illustrated in FIG. 1. Thus the flux should remain constant to a desired tolerance for the duration of the longest contemplated run. The furnace orifice, when the temperatures of the two zones are properly set will operate with tellurium based reagents without clogging and with a high degree of accuracy in the rate of film formation for periods of this length.

The thermal design of the MBE furnace deals with the radial temperature gradient due to the cryogenic shroud encircling each furnace. The thermal design of the present two zone furnace, as the preceding discussion has explained, also deals in a novel way with an axial temperature gradient existing at the mouth of the furnace for the purpose of avoiding clogging when processing tellurium.

The novel construction of the two zone furnace permitting efficient two zone operation is illustrated in FIGS. 3A, 4, 5A and 5B. In FIG. 3A the fill zone and orifice zones of the furnace are illustrated and a crucible is shown installed within the furnace. The illustration shows how the two zones of the furnace relate to the fill and orifice regions of the crucible.

The furnace is provided with two separate heating means for the respective zones. The means for heating the fill region is designed to maintain the charge contained within the crucible at a first temperature selected to establish a desired vapor pressure and thereby achieve a desired stable value of molecular flux.

The heating means for the first zone consists of an inner cylindrical frame 62, a heater subassembly 63-65 and 70-72, a nine layer insulating wrap 66 of light gauge tantalum, and a sheath 67 of heavier gauge tantalum. Also, a final optional etch protective layer of molybdenum 74 partially covers this region. The temperature of the first zone is regulated by a thermocouple 80, positioned to sense temperature at the bottom of the crucible, and connected to control the application of electrical current to the heater element.

The cylindrical furnace frame 62 is of an 0.005" tantalum foil, the base of which is welded to three legs 69 passing through the nipple 46 which attach the furnace assembly to the cover 50. As will be explained, the other parts of the first zone furnace are supported by the frame 62.

The fill zone heater subassembly consists of a heating element 63 set between an inner cylindrical heat radiator 64 of 0.005" tantalum foil and an outer cylindrical heat shield 65 of 0.005" tantalum foil. The ends of the members 64 and 65 toward the legs 69 are supported upon a refractory insulating disc 70, which has a central opening to accommodate a retractable thermocouple support 71. At successive axial positions along the fill zone, washer shaped insulators 72 are provided to support and insulate the resistance wires of the heating element from the inner heat radiator 64 and outer heat shield 65. The ends of the members 64 and 65 remote from the legs 69 are closed by a thin tantalum ring 73, which completes the enclosure of the heating element 63. The member 73 forms an end heat shield for reducing radiation directed along the axis of the assembly toward the opening, into which the heater for the second zone will be assembled. The heating element 63 extends through the enclosure (64, 65, 70, 73) just described, being set back from the disc 70 and from the end shield 73 by a small distance, typically about ¼".

The thermocouple 80 regulates the application of heating current to the heating element 63. The external terminals for connection to the thermocouple are supported on the flange cover 50, and enter the furnace through the nipple 46. The thermocouple, itself, is installed on a resiliently biased retractable post 71, through which the connections pass, and which biases the thermocouple into physical contact with the bottom of the crucible. The thermocouple is thus arranged to sense the temperature on the bottom surface of the crucible. This location of the thermocouple provides an indication of the temperature of the reagent which remains accurate from full charge until the reagent has been consumed.

The heater subassembly (63-65, 70-73) is placed within the foil frame 62 and supported thereby, with the disc 70 maintaining a substantial radial space between the outer foil 65 of the heater subassembly and the inside of the furnace frame 62 to effect a measure of heat shielding.

The furnace frame 62 also supports the main heat shield 66 for the first zone heating element. Heat shielding is provided by a nine layer wrap 66 of 0.002" tantalum, the surface of which is deformed to reduce the conductive contact between individual layers of the wrap and increase the quality of the shielding. The wrap 66 is then placed within a protective 0.005" tantalum sheath 67. A plurality of small lugs 68a and 68b set on the frame 62 and extending approximately ⅛ of an inch in and an ⅛ of an inch beyond the shield 73 prevent the wrap 66 from sliding axially along the frame 62. The main heat shield 66 is thus substantially coextensive with the heater element, terminating near the end heat shield 73. When a second zone heating element is not used the lugs 68b may be used with a wire to support the flange of a crucible. When a second zone heating element is added, as contemplated herein, the lugs 68b are extraneous, serving only to hold the wrap.

The first zone heater efficiently directs an inward flow of heat toward the crucible set inside and to a degree restricts the outward flow of heat toward the cryogenic shroud surrounding it. The heating element 63 is supported in the perforated spacers 72 with only the foil heat radiator 64 intervening between it and the crucible being heated. Thus the foil heat radiator 64 becomes hot from absorption of radiant heat, and it in turn radiantly heats the crucible which is placed immediately inside. The foil heat shield 65, outside the heating element, is also radiantly heated, and reflects some heat back toward the inner foil and radiates some heat radially outward to the furnace frame 62. The process of outward heat radiation and inward heat reflection is repeated nine times in the heat shield 66 surrounding the furnace frame 62 and once more in the sheath 67. The multiple layers with multiple inward reflections greatly reduce the outward flow of radiant heat. If the mechanical contact between successive layers is poor, as it is designed to be (e.g. by dimpling), the outward flow of heat by conduction is also reduced. Thus the heat loss to the encircling cryogenic shroud is held to a minimum.

The heating element 63 and the enclosure 64, 65, 70, 73 of the fill zone heating means are designed to distribute the heat more evenly over the cylindrical surface of the enclosed crucible than if the individual resistance wires of the heating element were exposed. The heat reaching the crucible is supplied by reradiation from the cylindrical foil heat radiator set between the heating element 63 and the outer surface of the crucible. The resistance wires making up the heating element extend substantially parallel to the axis of the furnace and are substantially evenly spaced about the circumference of the radiator 64. The portions of the foils 64 and 65 closest to the resistance wires in particular receive more radiant heat. The thermally conductive foil redistributes the heat by allowing it to spread out from the portion receiving more radiant heat to the portions further away from the heated conductors, which receive less radiant heat. Then the more uniformly heated surface of the foil radiator reradiates the heat in a more evenly diffused manner.

The crucible at the center of the furnace and the cryogenic shrouding provide no substantial variations in loading as one proceeds around the circumference of the furnace. Consequently the thin (0.005") and low thermal conductivity (tantalum) foils have adequate thermal conductance to perform the modest task of providing temperature equalization between heated conductors around the perimeter of the furnace, and accordingly circumferential gradients around the cylindrical surface of the crucible are reduced to the point where they are operationally negligible.

However, the thin (i.e. 0.005 inch) tantalum foil of the radiator 64, has insufficient thermal conductance to equalize the quite substantial axial temperature gradients which may appear near the chamber end of the furnace if the fill zone heating means is used without the orifice heating means between it and the reaction chamber. A minor part of this axial gradient may be due to a concentration of heat output toward the center of the heating element. This minor part can be modified by redistribution of the heating conductors. The major part of this axial gradient is due to the increasing thermal load presented by the proximity of the cooler reaction chamber (if a fill zone heating means is used alone).

The heat load for a furnace (whether of a single or dual zone design) tends to cause a substantial axial temperature gradient at the reaction chamber end. As earlier discussed, the heat load of the furnace is that of the crucible and reagent set within the furnace and in part that dissipated by the surroundings including that of the cryogenic shroud at liquid nitrogen temperature which surrounds the furnace and that presented by the interior of the reaction chamber, which is on the axis of the furnace at the reaction chamber end. The radial flow of heat into the cryogenic shroud, is reduced by the foil shielding (e.g. 66) placed between the heating element and the shroud, and may be small enough so that any axial temperature gradient reflecting the axial concentration of heat output toward the center of the furnace is negligible.

However, when the mouth of the furnace is open and exposed to the cooler reaction chamber, there is a very substantial heat load, drawing off heat axially toward the reaction chamber and increasing the axial temperature gradient at the furnace end. If the radiator (e.g. 64) and shield (e.g. 65) are of a thin tantalum foil, as in a conventional design, this axial gradient is not suppressed, while metallic parts of more substantial nature and of a more highly thermally conducting material might have suppressed this axial gradient.

In operation, this uneven axial temperature distribution poses a more severe problem for an effusion type crucible than the conventional open mouth crucible. The problem is particularly acute for tellurium based reagents, in which the tellurium vapor redeposits on relatively cooler surfaces above the fill region. The problem causes an undesirable gradual change in flux rate with an open mouth crucible and causes an intolerable change in flux rates ending in clogging with effusion type furnaces.

The problem with using a single zone furnace for effusion cell (Knudsen cell) operation cannot be avoided by simply raising the temperature throughout the furnace. As explained above, effusion cell crucibles have small orifices—often "collimating" orifices—which are of substantial length. These orifices are subject to clogging from high vapor pressure reagents such as Te based materials if the orifice temperature is not maintained sufficiently high to prevent recondensation of the reagent. The Te based materials, being high vapor pressure materials, require a relatively lower temperature to generate flux at a reasonable rate. Thus a single zone furnace would be hampered by the difficulty in maintaining a high enough temperature in the region of the orifice of an effusion type crucible to prevent clogging while maintaining a low enough temperature in the fill region to keep the evaporation rates low enough for uniform film formation. If the temperature of the reagent is raised to a high enough temperature to avoid clogging at the aperture, then the temperature of the reagent in the fill region would be too high, resulting an an evaporation rate which would be too high and too irregular for uniform film formation.

These objections are removed, in accordance with the invention, by the provision of the second zone heating means to supplement a first zone heating means and by use of a second zone heating means of a different design from the first zone heating means. The physical features of the second zone heating means, and the manner of its attachment to the first zone are best seen in FIGS. 3A and 3B, 4, and 5A-5D.

The second zone heating means is specifically designed to insure a uniformly high temperature throughout the orifice region of an effusion type crucible. This is the "orifice zone" of the heating means shown in FIG. 3A. Assuming an appropriately dimensioned crucible, the orifice zone of the heating means corresponds to the orifice region of the crucible as shown in FIG. 3B.

The fill and orifice zone heating means are of a thermal design which allows for a steep thermal gradient between zones, the orifice zone being held to the higher temperature which is nearly constant throughout the orifice region.

The heating means for the second zone of the furnace consists of a relatively massive cylindrical molybdenum heat radiator 82, 88 also providing the frame for the second zone furnace, an electrically insulated heating element 83 supported on the radiator, a heat shield 84, 85 consisting of a first eight layer tantalum foil wrap 84 encircling the heating element and a second two layer molybdenum foil wrap 85 designed primarily for etch resistance to tellurium based reagents and secondarily to provide additional thermal shielding; and finally an outermost molybdenum wrap 74 overlying the orifice zone and partially overlying the fill zone for etch resistance. (The wrap 74 was previously referred to in the description of the fill zone heating means.)

The configuration of the orifice zone heating means is best seen in FIG. 5B. The orifice zone heat radiator (82, 88) is a flanged cylindrical member 82. The flange 88 is located at the furnace opening oriented toward the reaction chamber. The cylindrical portion 82 is approximately three inches long, and except at the ends has the substantial thickness of 0.040". It is made of the refractory metal molybdenum, which has a greater heat conductivity than tantalum by a factor of three.

The orifice zone heating means is mechanically supported by the fill zone heating means by inserting the heat radiator 82, 88 of the orifice zone into the foil heat radiator 64 of the fill zone. The cylindrical attaching surface 86 of member 82 is approximately 1/5" in axial extent, with the outer diameter being decreased to end with a shoulder 87 which forms a stop when the two heating means are engaged. The wall thickness of member 82 remains a substantial 0.030 inches at the attaching surface. The fill zone heating means is mechanically stiffened at the point of connection to the orifice zone heating means by the closed hollow cylindrical structure formed by the foil heat radiator 64 with foil heat shield 65 and the end shield 73. The two mating surfaces are dimensioned to provide a loose, sliding fit.

The accommodation of the tapered diameter of a longer than customary crucible is achieved by increasing the inner diameter of the reaction chamber end of the radiator member 82 0.20" for a distance of 4/5" at the inner surface 89. The accommodation for crucible taper of the second zone heating means is consistent with the accommodation for taper of the first zone heating means, a uniformly tapered configuration being customary in available Pyrolytic Boron Nitride crucibles. The relatively massive ⅛"× 3/16" radiator flange extends around the chamber end of the radiator member 82 next to the flanges of the crucible.

The foregoing features of radiator design allow the flanges of the crucible 51 and of the orifice 52 to come into physical contact with the radiator flange 88 and provide close intimate spacing of the upper portion of the crucible 51 from the inner radiator surface 89 for good heat transfer. The increase in inner diameter of the radiator 82 to accommodate a longer crucible reduces the wall thickness of the radiator member at the chamber end, but the wall thickness is maintained at a substantial 0.030" important to maintaining temperature uniformity in the orifice zone.

Additional means (not shown) may be provided to maintain the crucible and orifice in contact with the radiator flange 88 against the outward pressure exerted on the bottom of the crucible by the resiliently biased (71) fill zone thermocouple 80.

The orifice zone heating element 83 and the relatively massive orifice zone heat radiator 82, 88 are designed to distribute the heat more evenly than the comparable elements of the fill zone heating means. The orifice zone heating element 83 is of a distributed design like the fill zone heating element 63 using spaced resistance wires. The orifice zone heating element distributes the heat over the radiator 82, 88, and it is reradiated over the adjoining crucible surfaces. The radiator 82, 88 extends over a portion of the crucible extending from the fill zone through the orifice zone to the open end of the crucible. The heat radiator 82, 88 not only smooths out the heat distribution over the cylindrical surface of the crucible and orifice reducing circumferential gradients, but it also equalizes the axial temperature gradients which tend to increase toward the chamber end of the furnace.

The reduction in axial temperature gradients in the orifice zone results from an increase in thermal conductance of the orifice zone radiator in respect to the fill zone radiator of almost ten to one. The greater thermal conductance in the orifice zone is attributable to the greater thermal conductivity of molybdenum (1.39 watts per cm per degree K) over that of tantalum (0.574 in corresponding units) and the thicker cross-section (0.040") of the molybdenum radiator 82, 88 over that (0.005") of the tantalum foil radiator 64.

The orifice zone heating means facilitates sustaining the orifice region of the crucible at a high and even temperature. This avoids condensation of the reagent and clogging of the orifice that might occur with localized cooler spots. The selection of the high thermal conductivity molybdehum of a substantial cross-section provides a high thermal conductance path through the radiator. Thus, the inner surfaces of the member 82, 88, may be assumed to share substantially uniform, high temperatures set by the heat supplied by the orifice zone heating element. The crucible, 51 and the cover 52 containing the orifice 53 are maintained in close proximity to these heated surfaces. Thus, the arrangement keeps the crucible parts (51, 52, 53) at the desired elevated temperature without experiencing the conventional droop in temperature at the furnace opening near the MBE reaction chamber.

The thermal design of the two zone furnace allows for a significant difference in temperature between An exemplary temperature selection is 475° C. in the fill zone and 550° C. in the orifice zone. These temperature selections are suitable for producing a standard flux of HgCdTe for a growth rate of 2 microns per hour for greatly extended periods of time.

The thermal design avoids creating a cooler spot within the orifice zone or at the boundary between zones. The design of the interface between zones provides both the desired thermal continuity necessary to avoiding a cooler spot and the ability to support 75° C. to 100° C. temperature gradients between zones.

The feature which avoids the undesired dip in temperature at the boundary between zones is the contiguity of the two zone heating means and the absence of a gap in the delivery of heat. The radiators for the two zones are not only contiguous, but the fill zone radiator 64 fits into the orifice zone radiator 82, 88, creating an overlap which presents an uninterrupted, continuous heat radiating surface to the contained crucible. The axial heat leakage from the hotter orifice zone to the fill zone due to conduction via the physical contact between radiators (and the absence of an axial thermal load for the fill zone), prevents the temperature at the joint between radiators from falling below the temperature of the fill zone. When, in normal operation, the higher temperature is maintained in the orifice zone, the gradient from the fill zone to the orifice zone never falls, but is always positive, climbing steeply and avoiding any cooler spots at the boundary between zones.

In spite of radiator contiguity including conductive physical contact, adequate thermal isolation is provided to permit attainment of a 75°-100° C. differential in operation with both heaters on (200° C. if the orifice zone heater is set at 500° C. and the fill zone heater is off). The thermal conductance through the fill zone radiator is quite small, corresponding roughly to the thermal conductance of one or perhaps two 0.005" tantalum foils (64, 65). The thermal conductance through the orifice zone radiator corresponds substantially to the 0.030" to 0.040" thick walls of the molybdenum member 82, 88. When the orifice zone radiator comes into contact with the fill zone radiator, a large flow of heat from the hotter orifice zone does not result. The low thermal conductivity and the small cross-section of the fill zone tantalum foils impede the flow of heat from the hotter orifice zone.

The thermal design of the furnace avoids substantial heat flows from the hotter orifice zone to the cooler fill zone by other mechanisms. The heat flow between zones must take place either from conduction or from radiation. Convection effects outside the crucible are negligible, due to operation of the system at a high vacuum. Heat flow between zones by conduction is limited to the contact between radiators and accidental contacts of the outer most etch protective molybdenum layer 74 which spans both zones. This path provides little thermal leakage between zones because of the spaced, loose contact with the underlying layers, which are themselves heat shields.

The heat shields of the respective zones are separated and do not themselves provide thermally conductive paths between zones. The heat shielding wrap 66 of the fill zone and wraps 84 and 85 of the orifice zone provide some conductive heat diffusion within their respective zones. This supplements the diffusion attributable to the individual heat radiators within the boundaries of each zone. The effect is not large because the individual layers of the shields are successively cooler as they are more remote from the heating element. Their separation however, avoids actual thermal conduction between zones.

Thus, any remaining heat flow between zones attributable to furnace design besides that earlier discussed is due to radiation between the adjoining parts. Heat leakage of this nature is also restricted. In particular, the heating elements 63 and 82 are both of a distributed design, intended to distribute heat radially to central and encircling heat loads with minimal heating in the axial dimension. Thus, separating the heating elements, and spacing them apart, and introducing the radial heat shield 73 between them greatly reduces the exchange of radial heat between zones. The heat shielding wrap 66 of the first zone and the heat shielding wraps 84 and 85 of the second zone are both separate and spaced apart. Since they are cooler as one approaches the outer layers, the amount of heat exchanged by radiation between zones by this mechanism is also small.

There is of course a further possible linkage between the heat zones not attributable to the furnace design. This linkage is that provided by the presence of a reagent such as Te which becomes molten within the crucible during evaporation. The crucible 51, 52 is itself a relatively poor thermal conductor. The molten tellurium reagent is a good conductor, comparable to that of common metals. Tellurium, s presence in the molten state substantially equalizes the temperature throughout its boundaries. Accordingly, if the crucible is over filled so that molten tellurium reaches the orifice zone of the furnace, the crucible will reach a temperature somewhere between that of the two zones and dual zone operation will be precluded.

Operation with an over filled crucible is readily avoided. The crucible is first charged with solid reagent to a point just below the collimating orifice, 53. Next the orifice zone heater is energized. Then the fill zone heater is energized. If there is excess reagent, the temperature of the furnace zones are maintained until the excess reagent is evaporated away. The presence of excess reagent is determined by the evaporation rate directly measured by the flux monitor. This monitor senses when excess reagent is removed and that the furnace has been prepared for normal two zone operation.

The solution proposed here for growing II-VI materials such as tellurium incorporates independently controlled dual-zone heating which departs from known designs. The present design incorporates an independently heated and independently insulated insert, principally made from molybdenum, which may be attached to a commercially available MBE furnace to provide the second zone for two zone operation.

The novel use of molybdenum in the construction of the furnace, particularly in the second zone, eliminates the self-destructive tantalum-tellurium reaction. The high thermal mass, high thermal conductance molybdenum construction permits improved temperature distribution, temperature control, and stability relative to conventional designs which use a low thermal mass and low thermal conductance tantalum foil construction.

Thermal cross-talk between the two heated regions may be carefully adjusted by the present design. The molybdenum radiator of the second zone has a high thermal conductance relative to that of the tantalum foil radiator of the first zone. The thermally conductive contact between radiators thus provides an effective means of joining the two zones for thermal continuity without forming a condensation inviting cooler boundary region between zones. The thermal conductance between radiators may be increased or decreased by altering the looseness and area of contact of their mechanical fit. Other measures maintain the desired isolation between zones. Two separate radiation shields are used rather than one to decrease heat transfer between the two zones. In addition, the heaters, which are of a distributed design, are both separated, shielded and spaced 0.5" apart in the practical embodiment.

The present design allows the thermocouple sensor to be set inside a radiative cavity within the substantial radiator member (the radiator flange 88) while in prior art designs the thermocouple sensor simply touches the crucible or foil shield. This feature protects the sensor from transient radiative effects emanating from other parts of the furnace which decreases sensor accuracy.

The concept of inserting the second zone into a preexistent single zone furnace also introduces other practical benefits. A simple port adapter with a standard electrical feed through may be used to attach the furnace flange to the MBE system. This permits the installation or removal of the two zone furnace assembly as one unit. The added length permits the use of crucibles having an approximately 30% larger volume than those currently available. This means that more material can be added to the furnace and thus the down time required for furnace replenishment is decreased. There is also a cost benefit in adding an insert for two zone operation in that the cost of creating an insert adapted to fit into an available single zone furnace is normally less than producing a two zone furnace in the first place.

What is claimed is:

1. A two zone electrical furnace for use in a molecular beam epitaxial (MBE) apparatus customarily utilizing plural furnaces, said apparatus having a reaction chamber maintained at a high vacuum with cryogenic shrouding encircling each furnace, said two zone furnace being designed for an effusion type crucible having a fill region for the reagent and an orifice region, said furnace comprising:

(1) fill zone heating means encircling the fill region of said crucible for heating said reagent within said fill region to a first temperature to establish a vapor pressure to achieve a desired value of molecular flux in said beam, comprising:

(a) a fill zone electrical heating element comprising a plurality of spaced resistance wires distributed around said fill zone, (b) a fill zone heat radiator of a refractory metal of relatively low thermal conductance disposed between said crucible and said fill zone heating element, said fill zone radiator having adequate thermal conductance for equalizing its surface temperature over the spaces between individual resistance wires, (c) a fill zone heat shield of a multiple layer refractory foil enclosing said fill zone heating element to reduce outward heat loss to said shroud, and (d) a fill zone thermostat responsive to temperature in said fill region for regulating the heat output of said fill zone heating element to maintain said first temperature;

(2) orifice zone heating means encircling said crucible for heating the orifice region of said crucible to a second temperature, higher than the first temperature, to prevent condensation of the reagent on the orifice, comprising (a) an orifice zone electrical heating element comprising a plurality of spaced resistance wires distributed around said orifice zone, (b) an orifice zone heat radiator of a refractory metal of a relatively high thermal conductance relative to said fill zone radiator, disposed between said crucible and said orifice region heating element, said orifice zone radiator having adequate thermal conductance for equalizing the surface temperature over the spaces between individual conductors and against thermal loading provided at the portion of the orifice zone proximate to the reaction chamber, (c) an orifice zone heat shield of a multiple layer refractory foil enclosing said orifice zone heating element to reduce outward heat loss to said cryogenic shroud, and (d) an orifice zone thermostat responsive to the temperature in said orifice region for regulating the heat output of said orifice zone heating element to maintain said second temperature, said fill zone and orifice zone heating means, while contiguous to prevent a fall in temperature between zones being in a low heat exchanging relationship to permit a large temperature difference between zones, said heat radiators being in contact while said heating elements and heat shields of the respective zones are separated and spaced apart to prevent heat conductive contact and to reduce radiation coupling between zones.

2. The combination set forth in claim 1, wherein said fill zone radiator is of a thin tantalum foil extending through said fill zone having a low thermal conductance for tolerance to axial thermal gradients, and said orifice zone radiator is a rigid molybdenum member extending through said orifice zone of a thick cross section relative to said foil radiator and having a high thermal conductance for suppressing axial thermal gradients.

3. The combination set forth in claim 1, wherein said orifice zone radiator is of a cylindrical configuration, having a thick washer shaped flange at the chamber end of the radiator, and wherein said orifice zone thermostat is set inside said flange to provide a black body temperature closely reflecting that throughout said radiator, and by inference the temperature of said orifice.

4. The combination set forth in claim 2, wherein said fill zone radiator and said orifice zone radiator are in physical contact at the boundary between zones to present an axially continuous heated surface to said crucible to avoid cool spots at the zone boundary.

5. The combination set forth in claim 4, wherein said fill zone radiator and said orifice zone radiators have axially increasing inner diameters to accommodate an elongated continuously tapered crucible, said orifice zone radiator fitting inside said fill zone radiator.

6. The combination set forth in claim 5, wherein said fill zone heat shield is of tantalum foil and said orifice zone heat shield is of two parts, the inner part being of tantalum, and the outer part of molybdenum for etch resistance to tellurium based reagents.

7. The combination set forth in claim 6, wherein a molybdenum shield is provided extending from said flange over said orifice zone heat shield and over at least a portion of said fill zone heat shield for etch resistance to tellurium based reagents.

* * * * *